(12) United States Patent
Giusti et al.

(10) Patent No.: US 12,251,729 B2
(45) Date of Patent: Mar. 18, 2025

(54) PIEZOELECTRIC MICROMACHINED ULTRASONIC TRANSDUCER COMPRISING A LOBED MEMBRANE ELEMENT AND METHODS OF MANUFACTURING THEREOF

(71) Applicant: STMicroelectronics S.r.l., Agrate Brianza (IT)

(72) Inventors: Domenico Giusti, Caponago (IT); Fabio Quaglia, Pizzale (IT); Marco Ferrera, Concorezzo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 803 days.

(21) Appl. No.: 17/497,542

(22) Filed: Oct. 8, 2021

(65) Prior Publication Data
US 2022/0118480 A1     Apr. 21, 2022

(30) Foreign Application Priority Data
Oct. 16, 2020   (IT) .......................... 102020000024469

(51) Int. Cl.
*B06B 1/06* (2006.01)
*B81B 3/00* (2006.01)
(Continued)

(52) U.S. Cl.
CPC .......... *B06B 1/0622* (2013.01); *B81B 3/0021* (2013.01); *B81B 7/0016* (2013.01);
(Continued)

(58) Field of Classification Search
CPC ... B06B 1/0622; B06B 1/0681; B06B 1/0666; B06B 1/0662; B81B 3/0021;
(Continued)

(56) References Cited

U.S. PATENT DOCUMENTS

| 7,294,536 B2 | 11/2007 | Villa et al. |
| 2006/0238067 A1 | 10/2006 | Dausch |

(Continued)

FOREIGN PATENT DOCUMENTS

| CN | 103458795 A | 12/2013 |
| CN | 106660074 A | 5/2017 |

(Continued)

*Primary Examiner* — Emily P Pham
(74) *Attorney, Agent, or Firm* — Seed IP Law Group LLP

(57) ABSTRACT

A PMUT device includes a membrane element extending perpendicularly to a first direction and configured to generate and receive ultrasonic waves by oscillating about an equilibrium position. At least two piezoelectric elements are included, with each one located over the membrane element along the first direction and configured to cause the membrane element to oscillate when electric signals are applied to the piezoelectric element, and generate electric signals in response to oscillations of the membrane element. The membrane element has a lobed shape along a plane perpendicular to the first direction, with the lobed shape including at least two lobes. The membrane element includes for each piezoelectric member a corresponding membrane portion including a corresponding lobe, with each piezoelectric member being located over its corresponding membrane portion.

20 Claims, 7 Drawing Sheets

(51) Int. Cl.
  *B81B 7/00* (2006.01)
  *B81C 1/00* (2006.01)
  *H10N 30/20* (2023.01)
  *H10N 30/30* (2023.01)

(52) U.S. Cl.
  CPC ..... *B81C 1/00158* (2013.01); *H10N 30/2047* (2023.02); *H10N 30/308* (2023.02)

(58) Field of Classification Search
  CPC .............. B81B 7/0016; B81C 1/00158; H10N 20/2047; H10N 20/308
  See application file for complete search history.

(56) References Cited

U.S. PATENT DOCUMENTS

| | | |
|---|---|---|
| 2008/0261345 A1 | 10/2008 | Villa et al. |
| 2009/0107243 A1 | 4/2009 | Sugiura et al. |
| 2010/0168583 A1 | 7/2010 | Dausch et al. |
| 2012/0267986 A1 | 10/2012 | Galluzzo et al. |
| 2014/0214209 A1 | 7/2014 | Sugiura et al. |
| 2016/0288169 A1 | 10/2016 | Bae et al. |
| 2017/0021391 A1 | 1/2017 | Guedes et al. |
| 2018/0153512 A1 | 6/2018 | Akkaraju et al. |
| 2019/0351453 A1* | 11/2019 | Frey ..................... B06B 1/0685 |
| 2020/0100033 A1 | 3/2020 | Stoppel et al. |
| 2020/0322730 A1 | 10/2020 | Kamiya et al. |
| 2022/0118480 A1 | 4/2022 | Giusti et al. |

FOREIGN PATENT DOCUMENTS

| | | |
|---|---|---|
| CN | 207287973 U | 5/2018 |
| CN | 109530194 A | 3/2019 |
| CN | 110180770 A | 8/2019 |
| JP | 2001-16694 A | 1/2001 |
| WO | 2011/078218 A1 | 6/2011 |

* cited by examiner

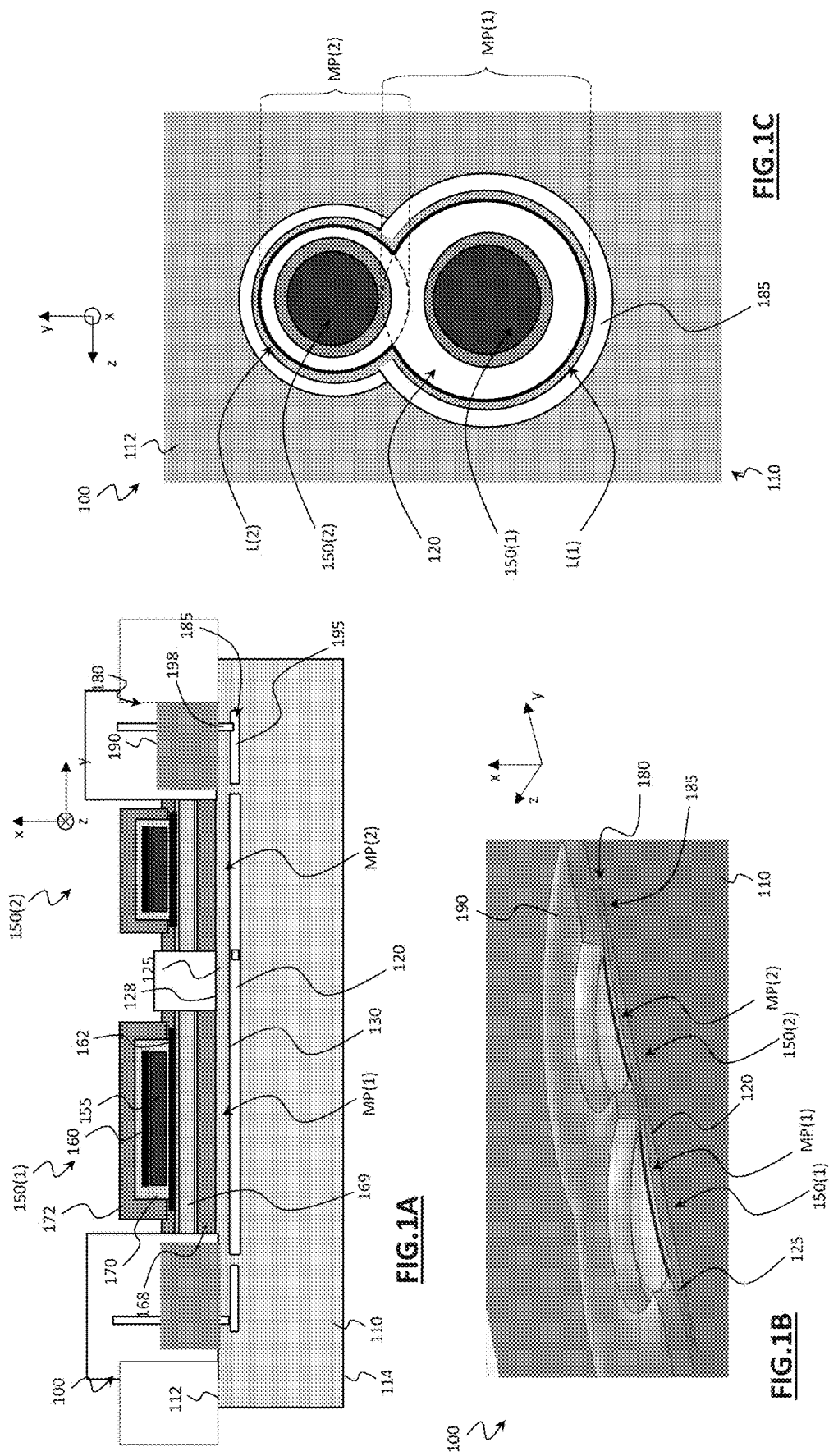

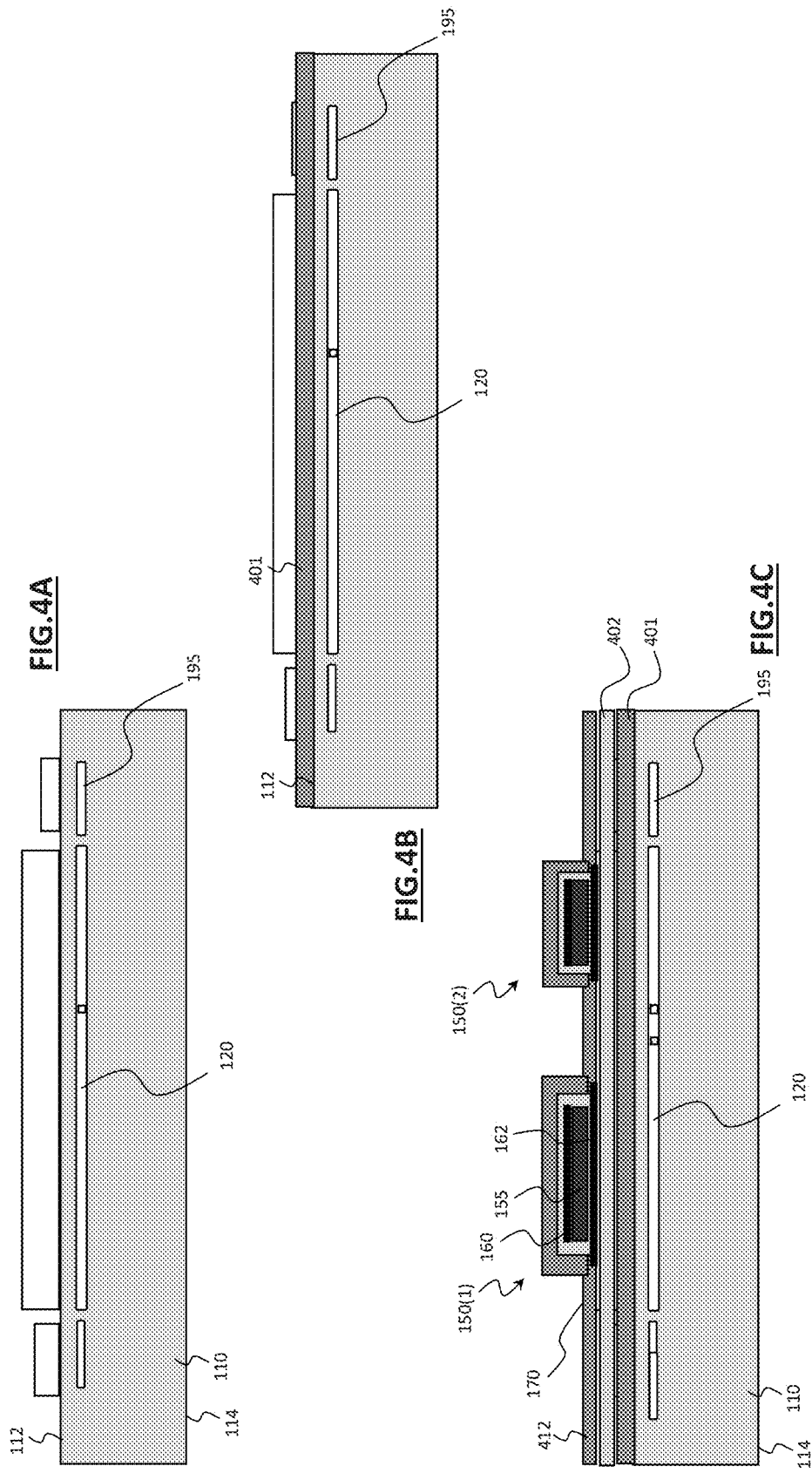

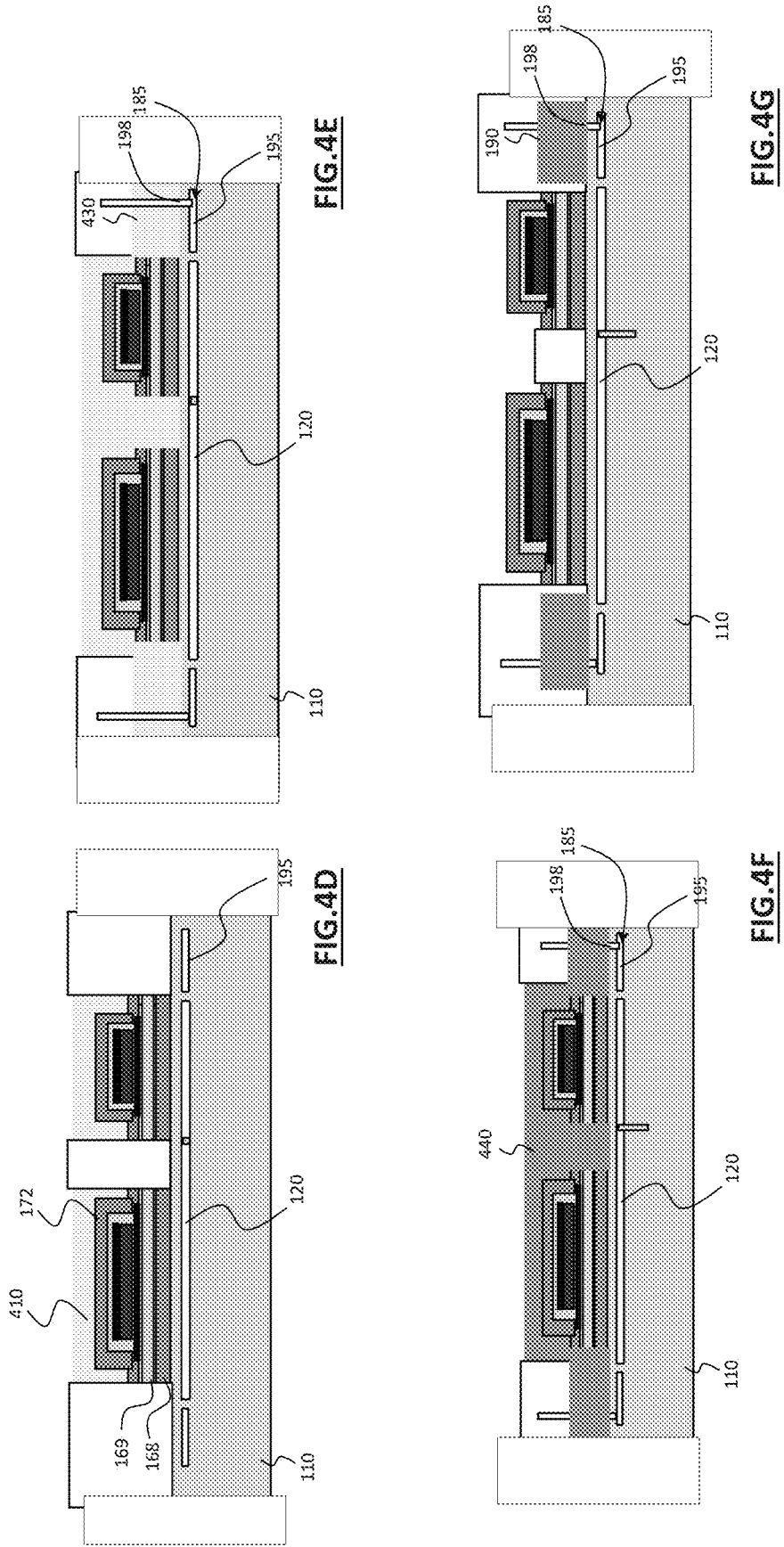

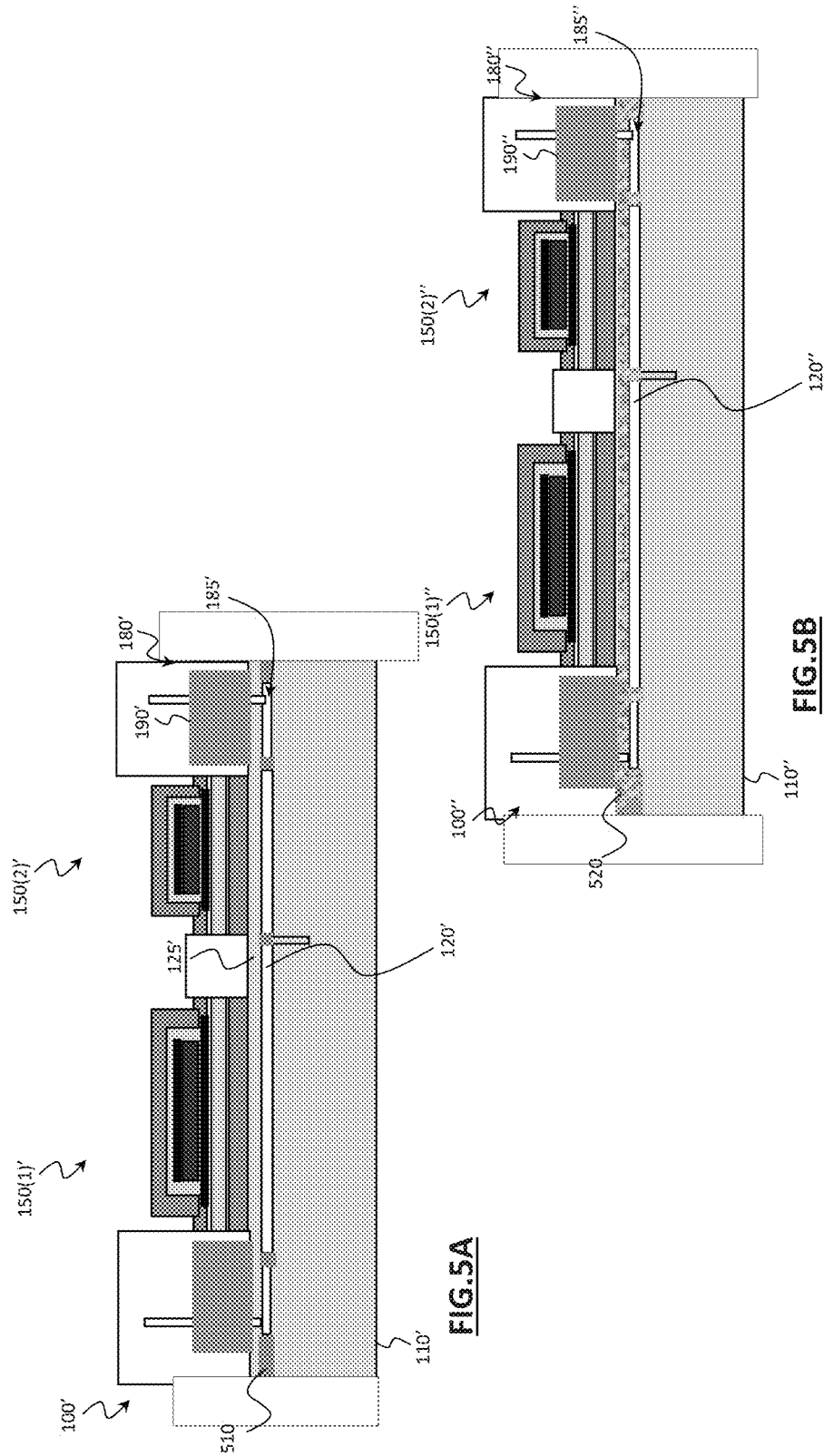

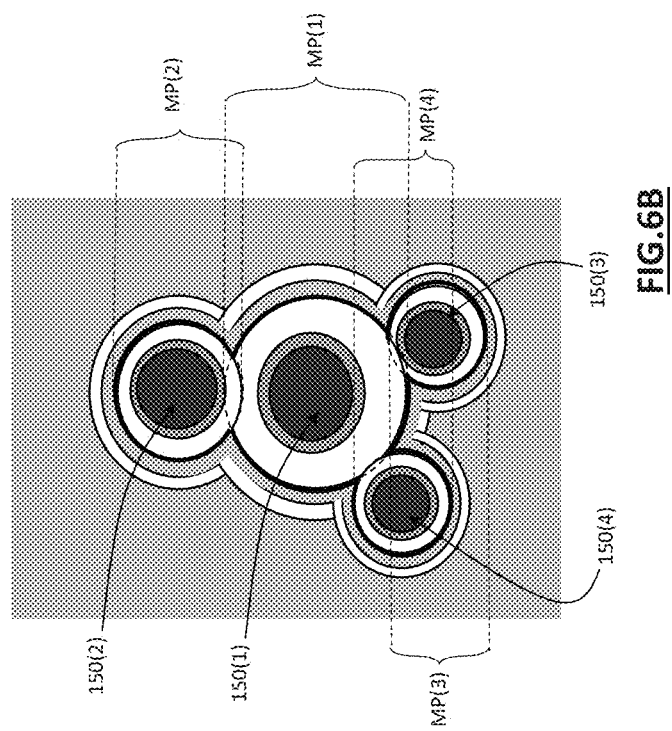
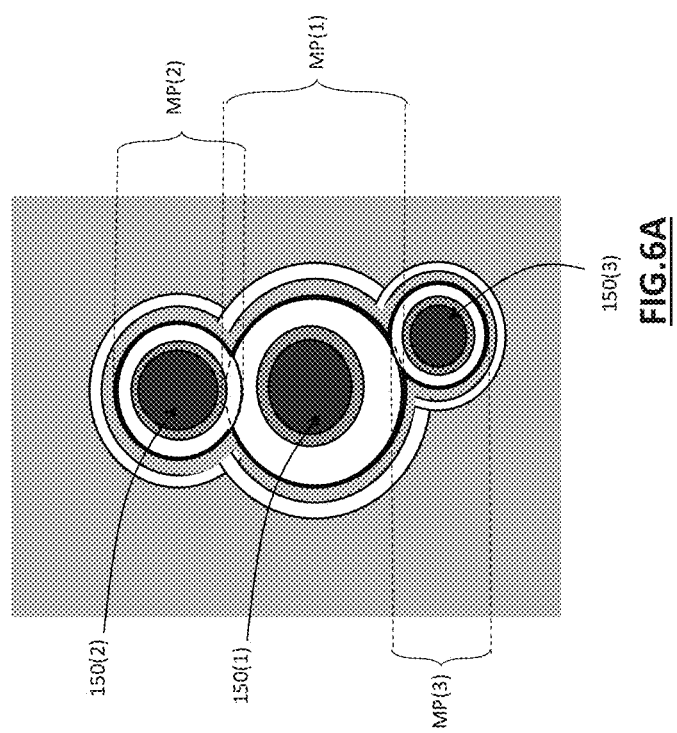

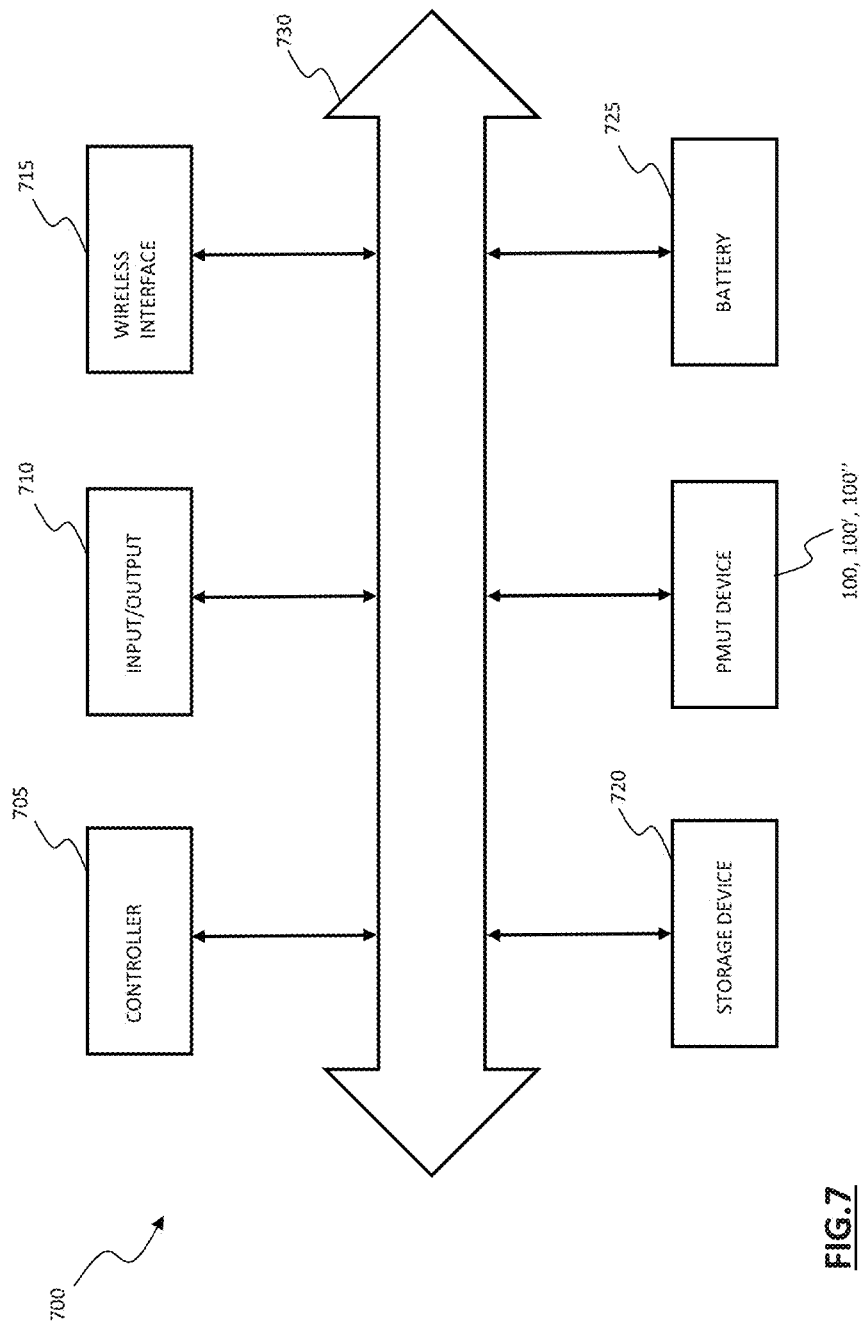

PIEZOELECTRIC MICROMACHINED ULTRASONIC TRANSDUCER COMPRISING A LOBED MEMBRANE ELEMENT AND METHODS OF MANUFACTURING THEREOF

BACKGROUND

Technical Field

The present disclosure relates to the field of the Micro Electro Mechanical Systems (hereinafter referred to as "MEMS"). Particularly, the present disclosure relates to a Piezoelectric Micromachined Ultrasonic Transducer (hereinafter, referred to as "PMUT").

Description of the Related Art

A MEMS device comprises miniaturized mechanical, electrical and/or electronic components integrated in a same semiconductor material substrate, for example silicon, by means of micromachining techniques (for example, lithography, deposition, etching, deposition, growth).

A Micromachined Ultrasonic Transducer device (hereinafter referred to as "MUT device") is a kind of MEMS device adapted to transmit/receive ultrasonic waves with frequencies above 20 kHz. Among the known MUT devices, the Piezoelectric MUT devices (hereinafter referred to as "PMUT devices") are known. A PMUT device is a MUT device whose operation is based on the flexural motion of one or more thin membrane elements mechanically coupled with a thin piezoelectric element.

When the PMUT device operates as a transmitter, the membrane element flexes and oscillates about an equilibrium position under the action of the piezoelectric element when an AC electric signal is applied to the latter. The oscillations of the membrane element thus cause the generation of ultrasonic waves.

When the PMUT device operates as a receiver, ultrasonic waves hitting the membrane element cause the membrane to oscillate about its equilibrium position. The oscillations of the membrane element act on the piezoelectric element, which accordingly generates a corresponding AC electric signal.

During the generation and the reception of ultrasonic waves (i.e., both in the case in which the PMUT device operates as a transmitter and in the case in which the PMUT device operates as a receiver), the membrane element oscillates about its equilibrium position at a corresponding resonance frequency.

A PMUT device can be expediently used in proximity and ranging applications for assessing the position and/or distance of obstacles/targets. More particularly, the PMUT device transmits a ultrasonic wave pulse. When hitting an obstacle/target, the ultrasonic wave pulse is reflected back in the form of a echo wave. The PMUT device receives the echo wave, and converts it in the electric domain to form a corresponding AC electric signal, which is then amplified and processed to extract a time-of-flight information (i.e., the time spent from the transmission of the ultrasonic wave pulse to the reception of the echo wave). The time-of-flight information is then processed for calculating the position and/or distance of the obstacle/target with respect to the PMUT device. This kind of application is usually employed in scenarios in which the ultrasonic wave pulse and the echo wave travels in a low-density medium, such as for example air.

Typical PMUT devices are negatively affected by a low damping factor when operating in a low-density medium, like air, so that undesired free oscillations cannot be efficiently suppressed. Said free oscillations cause the generation of a so-called ringing signal which negatively affect the correct reception and detection of echo waves reflected by obstacles/targets in response to the transmission of a ultrasonic wave pulse.

The higher the Q-factor of the PMUT device, the longer the duration of the ringing signal caused by free oscillations. This problem is exacerbated when the membrane of the PMUT is oscillating in the frequency range of 2 MHz, because the damping factor corresponding to air at these frequencies is particularly low.

In order to mitigate these problem for improving the echo wave detection, the "blind zone" of the PMUT—i.e., the spatial zone where the echo overcome the ringing—, and therefore the bandwidth of the PMUT device, should be increased.

According to solutions known in the art, the bandwidth of the PMUT device is increased by providing a damper configured to reduce the free oscillations. For example, the PMUT device may be equipped with a passive or an active damper (an active damper being a damper configured to carry out a counter-phase excitation after an active pulse).

According to another solution known in the art, algorithms are provided to detect decay variation of an envelope of the ringing due to an echo wave.

BRIEF SUMMARY

The Applicant has found that the known solutions for increasing the bandwidth of the PMUT device in order to improve echo wave detection are not efficient because affected by drawbacks.

Particularly, the known solutions employing a passive damper cause a strong power dissipation. Moreover, due to the variation of environmental conditions, the passive dampers of the known solutions cannot easily allow a perfect match with the impedance of the PMUT device.

The known solutions providing for active dampers are negatively affected by impedance matching problems.

The known solutions employing algorithms to detect decay variation of an envelope of the ringing are strongly dependent on the shape of the echo wave and on the obstacle/target.

In view of the above, the Applicant has devised an improved PMUT device having an increased bandwidth that at the same time is not affected by the abovementioned drawbacks affected the solutions known in the art.

An aspect of the present disclosure relates to a PMUT device.

The PMUT device comprises:

a membrane element extending perpendicularly to a first direction and adapted to generate and receive ultrasonic waves by oscillating about an equilibrium position;

at least two piezoelectric elements each one located over said membrane element along said first direction and configured to:

cause the membrane element to oscillate when electric signals are applied to the piezoelectric element, and generate electric signals in response to oscillations of the membrane element, wherein:

the membrane element has a lobed shape along a plane perpendicular to the first direction, said lobed shape comprising at least two lobes;

the membrane element comprises for each piezoelectric member a corresponding membrane portion including a corresponding lobe, each piezoelectric member being located over its corresponding membrane portion.

According to an embodiment of the present disclosure, each membrane portion has a same shape but a size different from the size of the other membrane portions.

According to an embodiment of the present disclosure, each membrane portion is the largest portion of the membrane element having said shape surrounding the corresponding piezoelectric member coaxial thereto.

According to an embodiment of the present disclosure, said shape is a selected one among:
 a substantially circular shape;
 a substantially square shape;
 a substantially rectangular shape;
 a substantially triangular shape;
 a substantially hexagonal shape;
 a substantially octagonal shape.

According to an embodiment of the present disclosure, the PMUT device further comprises:
 a damper configured to reduce free oscillations of the membrane element, the damper comprising:
 a damper cavity surrounding the membrane element;
 a polymeric member having at least a portion thereof over said damper cavity along said first direction.

According to an embodiment of the present disclosure, said polymeric member comprises a polymeric material.

According to an embodiment of the present disclosure, said polymeric material has a viscosity having a value ranging from 0.3 to 3 kPa*s.

According to an embodiment of the present disclosure, said polymeric material has a Young's modulus having a value ranging from 0.5 to 2 GPa.

According to an embodiment of the present disclosure, said damper cavity encircles the membrane element along a plane substantially perpendicular to said first direction.

According to an embodiment of the present disclosure, the PMUT device comprises a semiconductor substrate.

According to an embodiment of the present disclosure, said damper cavity is at least partially formed in said semiconductor substrate.

According to an embodiment of the present disclosure, the PMUT device further comprises a central cavity under said membrane element along said first direction.

According to an embodiment of the present disclosure, said damper cavity surrounds the central cavity perpendicularly to said first direction.

According to an embodiment of the present disclosure, said membrane element comprises monocrystalline silicon or polysilicon.

Another aspect of the present disclosure relates to an electronic system comprising at least one or more PMUT devices.

Another aspect of the present disclosure relates to a method for manufacturing a PMUT device.

According to an embodiment of the present disclosure, the method comprises the following phases:
 forming a membrane element extending perpendicularly to a first direction;
 forming over said membrane element along the first direction at least two piezoelectric elements, wherein:
 the membrane element has a lobed shape along a plane perpendicular to the first direction, said lobed shape comprising at least two lobes, the membrane element comprising for each piezoelectric member a corresponding membrane portion including a corresponding lobe, each piezoelectric member being located over its corresponding membrane portion.

According to an embodiment of the present disclosure, the method further comprises
 forming a damper, said forming a damper comprising:
 forming damper cavity surrounding the membrane element, and
 forming a polymeric member having at least a portion thereof over said damper cavity along said first direction.

BRIEF DESCRIPTION OF THE SEVERAL VIEWS OF THE DRAWINGS

These and other features and advantages of the solution according to the present disclosure will be better understood by reading the following detailed description of an embodiment thereof, provided merely by way of non-limitative example, to be read in conjunction with the attached drawings. On this regard, it is explicitly intended that the drawings are not necessarily drawn to scale (with some details thereof that can be exaggerated and/or simplified) and that, unless otherwise stated, they are simply used for conceptually illustrating the described structures and procedures. Particularly:

FIG. 1A schematically illustrates a cross section view of a PMUT device according to an embodiment of the present disclosure;

FIG. 1B illustrates a perspective view of a portion of the PMUT device of FIG. 1A;

FIG. 1C illustrates a plan view of the PMUT device of FIGS. 1A and 1B.

FIGS. 4A-4G illustrate main phases of a manufacturing process for manufacturing the PMUT device of FIGS. 1A-1C according to an embodiment of the present disclosure;

FIGS. 5A and 5B show PMUT devices according to other embodiments of the present disclosure;

FIG. 6A illustrates a plan view of a PMUT according to another embodiment of the disclosure;

FIG. 6B illustrates a plan view of a PMUT according to another embodiment of the disclosure;

FIG. 7 illustrates in terms of simplified blocks an electronic system comprising at least one of the PMUT devices of FIGS. 1A-1C, 5A, 5B, 6A, 6B.

DETAILED DESCRIPTION

Figure 3A:
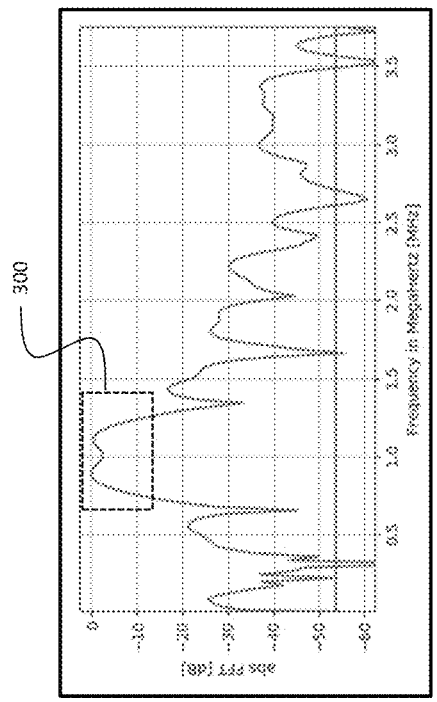
FIGS. 3A and 3B depict diagrams of the frequency response of the PMUT device of FIGS. 1A and 1C.

FIG. 1A schematically illustrates a cross section view of a PMUT device, globally identified with reference 100, according to an embodiment of the present disclosure.

In the following of the present description, direction terminology (such as for example, top, bottom, higher, lower, lateral, central longitudinal, transversal, vertical) will be only used for describing the PMUT device 100 in relation to the very specific orientation illustrated in the figures, and not for describing possible specific orientation the PMUT device 100 will have during its operation.

On this regard, a reference direction system is shown including three orthogonal directions X, Y, Z.

FIG. 1B illustrates a perspective view of a portion of the PMUT device 100 of FIG. 1A obtained by centrally cutting the PMUT device 100 along a section plane parallel to directions X and Y.

FIG. 1C illustrates a plan view of the PMUT device 100 of FIGS. 1A and 1B with partially removed portions taken from a plane parallel to directions Y and Z.

According to an embodiment of the present disclosure, the PMUT device 100 comprises a semiconductor substrate 110 integrating the components of the PMUT device 100 itself. According to an embodiment of the present disclosure, the semiconductor substrate 110 is a monocrystalline silicon substrate, hereinafter simply referred to as silicon substrate 110. The silicon substrate 110 of the PMUT device 100 illustrated in FIG. 1 has a front operative surface 112 and an opposite (along direction X) back operative surface 114. The front operative surface 112 and the back operative surface 114 extend parallel to directions Y and Z.

According to an embodiment of the present disclosure, the silicon substrate 110 comprises a cavity 120 defining a hollow space delimited by lateral walls extending substantially along the direction X, a bottom wall extending substantially along directions Y and X, and a top wall extending substantially along directions Y and Z. Similar considerations apply in case the lateral walls of the cavity 120 are slanted with respect to the direction X and/or the bottom and/or the top walls of the cavity are slanted with respect to the direction Z and/or to the direction Y.

According to an embodiment of the present disclosure, the PMUT device 100 comprises a membrane element 125 located over the cavity 120 along direction X. FIG. 1C only depicts an outline of the membrane element 125, so as to show the underlying cavity 120.

The membrane element 125 is adapted to generate and receive ultrasonic waves by oscillating, about an equilibrium position, at a corresponding resonance frequency. According to an embodiment of the present disclosure, the PMUT device 100 has a resonance frequency that is of the order of few MHz.

According to an embodiment of the present disclosure, the membrane element 125 has a top surface 128 and a bottom surface 130, extending substantially along directions Y and Z.

According to an embodiment of the present disclosure, the bottom surface 130 of the membrane element 125 corresponds to the top surface of the hollow space defined by the cavity 120.

According to an embodiment of the present disclosure, the top surface 128 of the membrane element 125 is flush with the front operative surface 112 of the silicon substrate 110.

According to an embodiment of the present disclosure, the membrane element 125 is made of the same material of the silicon substrate 110, i.e., silicon, particularly monocrystalline silicon.

According to an embodiment of the present disclosure, the membrane element 125 has a thickness (along the direction X) ranging from 1 µm to 50 µm. According to an embodiment of the present disclosure, the membrane element 125 has a thickness of about 5 µm, for example 5.2 µm.

According to an embodiment of the present disclosure, the PMUT device 100 comprises at least two piezoelectric elements located on the top surface 128 of the membrane element 125.

According to the embodiment of the disclosure illustrated in FIGS. 1A-1C, the PMUT device 100 comprises a first piezoelectric element 150(1) and a second piezoelectric element 150(2) located on the top surface 128 of the membrane element 125.

The first piezoelectric element 150(1) is configured to:

cause the membrane element 125 to oscillate when electric signals are applied across the piezoelectric element 150(1), and generate electric signals in response to oscillations of the membrane element 125.

Similarly, the second piezoelectric element 150(2) is configured to:

cause the membrane element 125 to oscillate when electric signals are applied across the piezoelectric element 150(2), and generate electric signals in response to oscillations of the membrane element 125.

As will described in greater detail in the following, the first piezoelectric element 150(1) and the second piezoelectric element 150(2) are configured to be operated at the same time.

According to an embodiment of the present disclosure, the piezoelectric elements 150(1) and 150(2) have a circular (or substantially circular) shape (along a plane parallel to directions Y and Z). According to other embodiments of the present disclosure, the piezoelectric elements 150(1) and 150(2) have different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the piezoelectric elements 150(1) and 150(2) comprise a layer of piezoelectric material 155, e.g., comprising aluminum nitride, between a first conductive layer 160 and a second conductive layer 162. According to an embodiment of the present disclosure, the first conductive layer 160 comprises titanium-tungsten (TiW). According to an embodiment of the present disclosure, the second conductive layer 162 platinum. Similar considerations apply if other conductive materials are used for the first and second conductive layers 160, 162.

The first layer 160 and the second layer 162 form electrodes of the piezoelectric elements 150(1), 150(2) across which it is possible to:

apply electric signals to the piezoelectric material 155 for causing oscillations of the membrane element 125 for transmitting ultrasonic wave pulses, and collect electric signals generated by the piezoelectric material 155 in response to oscillations of the membrane element 125, for example caused by the reception of echo waves.

According to an embodiment of the present disclosure, an insulating element, comprising a silicon dioxide layer 168 and an Undoped Silicate Glass (USG) layer 169, is located between the piezoelectric elements 150(1), 150(2) and the membrane element 125.

According to an embodiment of the present disclosure, the piezoelectric elements 150(1), 150(2) are covered with a passivation element, for example comprising a first passivation layer 170 (comprising Undoped Silicate Glass (USG)) and a second passivation layer 172 (over the first passivation layer 170) comprising Silicon Nitride. Naturally, similar consideration applies if the passivation element comprise a single passivation layer and/or if different passivation materials are used.

According to the embodiments of the present disclosure the shape of the membrane element 125 along directions Y and Z is lobed, i.e., it comprises at least two lobes or protrusions along directions Y and Z. In other words, the shape of the membrane element 125 along directions Y and Z is concave, i.e., it has a shape that curves or bends inward, or, from a more formal point of view, a shape that allows to trace at least one line segment between two points of the shape, with said line segment that falls at least partially outside the shape itself.

According to the embodiments of the present disclosure, the lobed-shaped membrane element 125 comprises for each piezoelectric member a corresponding membrane portion including a corresponding one of the lobes. According to an embodiment of the present disclosure, each piezoelectric member is located over (along direction X) its corresponding membrane portion.

Making reference to the embodiment of the disclosure illustrated in FIGS. 1A, 1B, 1C, the membrane element 125 has an eight-like shape, comprising two lobes, and particularly a first lobe L(1) and a second lobe L(2).

According to this embodiment of the disclosure, in which two piezoelectric elements 150(1), 150(2) are provided, the membrane element 125 comprises:

a first membrane portion MP(1) corresponding to the piezoelectric element 150(1), and comprising the first lobe L(1), and a second membrane portion MP(2) corresponding to the piezoelectric element 150(2), and comprising the first lobe L(2).

As can be seen in FIG. 1C, the first membrane portion MP(1) and the second membrane portion MP(2) partially overlaps one to another.

According to an embodiment of the present disclosure, each membrane portion has a same shape, such as for example a circular (or substantially circular) shape, a square (or substantially square) shape, a rectangular (or substantially rectangular) shape, a triangular (or substantially triangular) shape, a hexagonal (or substantially hexagonal) shape, or an octagonal (or substantially octagonal) shape.

In the embodiment of the disclosure illustrated in FIGS. 1A, 1B, 1C, the first membrane portion MP(1) and the second membrane portion MP(2) have a circular shape.

According to an embodiment of the present disclosure, each membrane portion has a same shape but at the same it has a size different from the size of the other membrane portions.

In the embodiment of the disclosure illustrated in FIGS. 1A, 1B, 1C, the first membrane portion MP(1) is larger than the second membrane portion MP(2).

For example, according to an exemplary embodiment of the disclosure, the first membrane portion MP(1) has a diameter of about 300 µm and the second membrane portion MP(2) has a diameter of about 260 µm. Naturally, the concepts of the present disclosure directly apply to different diameter values.

According to an embodiment of the present disclosure, each membrane portion is the largest portion of the membrane element 125 having said same shape that surrounds the corresponding piezoelectric member coaxial thereto.

By making reference to the embodiment of the disclosure illustrated in FIG. 1C:

the first membrane portion MP(1) is the largest circular portion of the whole membrane element 125 that surrounds the piezoelectric member 150(1) coaxial thereto;

the second membrane portion MP(2) is the largest circular portion of the whole membrane element 125 that surrounds the piezoelectric member 150(2) coaxial thereto.

The PMUT device 100 according to the embodiments of the disclosure is conceptually given by the union of two or more partially overlapped base PMUT devices (each one including a single piezoelectric element) so as to share a same, single membrane element 125 having a lobed shape. Said single membrane element is subdivided in (partially overlapping) membrane portions, each one corresponding to a respective one base PMUT device.

For example, the PMUT device 100 of the embodiment of the disclosure illustrated in FIGS. 1A-1C can be conceptually given by the union of a first base PMUT device having a membrane element corresponding to the first membrane portion MP(1) and a second base PMUT device having a membrane element corresponding to the second membrane portion MP(2).

If each one of said conceptual base PMUT device was considered alone, the membrane element thereof—corresponding to a specific membrane portion of the whole membrane element 125—would oscillate at a resonance frequency given by the size of said specific membrane portion.

Thanks to the partial overlapping of the membrane portions, such membrane portions have resonance frequencies substantially close to each other. The bandwidth of the PMUT device 100 having the membrane element 125 according to the embodiments of the disclosure is given by the union/overlapping of the bandwidths corresponding to the various membrane portions of the membrane element 125. Since the resonance frequencies corresponding to the various membrane portions of the membrane element 125 are selected to be close to each other, the union/overlapping of the bandwidths corresponding to said membrane portions causes an advantageous increase in the resulting bandwidth of the PMUT device 100.

According to an embodiment of the present disclosure, the PMUT device 100 comprises a damper 180 configured to reduce (damp) undesired free oscillations of the membrane element 125, thereby further increasing the bandwidth of the PMUT device 100 itself.

According to an embodiment of the present disclosure, the damper 180 comprises a cavity 185 that surrounds the membrane element 125.

According to an embodiment of the present disclosure, the cavity 185 of the damper 180 is formed in the silicon substrate 110 in such a way to surround the membrane element 125 with respect to directions Y and Z.

According to an embodiment of the present disclosure, the damper 180 further comprises a polymeric member 190 over the cavity 185 along direction X.

According to an embodiment of the present disclosure, the polymeric member 190 of the damper 180 is located above the cavity of the damper 180 along direction X.

According to an embodiment of the present disclosure, the polymeric member 190 of the damper 180 surrounds the membrane element 125 with respect to directions Y and X.

According to an embodiment of the present disclosure, the cavity 185 of the damper 180 and the membrane element 125 are substantially concentric to one another, with the cavity 185 that encircles the membrane element 125 along a plane substantially parallel to directions Y and Z.

The presence of the cavity 185 below the polymeric member 190 advantageously ensures that the polymeric member 190 surrounding the membrane element 125 efficiently damps undesired free oscillations affecting the membrane element 125.

According to an embodiment of the present disclosure, the cavity 185 of the damper 180 comprises:

a horizontal portion 195 having a top surface parallel to and aligned with the top wall of the cavity 120 (and therefore parallel to and aligned with the bottom surface 130 of the membrane element 125) and a bottom surface parallel to and aligned with the bottom wall of the cavity 120, and a vertical portion 198 comprising a trench opened in the front operative surface 112 of the silicon substrate 110 and extending along direction X until reaching the horizontal portion 195.

According to an exemplary embodiment of the present disclosure, the width of the horizontal portion 195 perpendicularly to direction X is 55 μm. Naturally, the concepts of the present disclosure directly apply to different width values.

According to an embodiment of the present disclosure, the polymeric member 190 rests on the front operative surface 112 of the silicon substrate 110 in such a way to cover—along direction X—the vertical portion 198 of the cavity 185 of the damper 180.

According to an exemplary embodiment of the present disclosure, the thickness of the polymeric member 190 along direction X is 20 μm. Naturally, the concepts of the present disclosure directly apply to different thickness values.

The damper 180 according to the embodiments of the present disclosure is configured to efficiently damp the free oscillations of the membrane element 125 by properly setting the viscosity and/or the Young's modulus of the polymeric material of the polymeric member 190. Indeed, Applicant has observed that the viscosity of the polymeric material has a very large impact on the % bandwidth, and the Young's modulus of the polymeric material has a quite large impact on the % bandwidth. Conversely, Applicant found that the Poisson's ratio and the density of the polymeric material do not have any significant impact on the % bandwidth.

Figure 2:
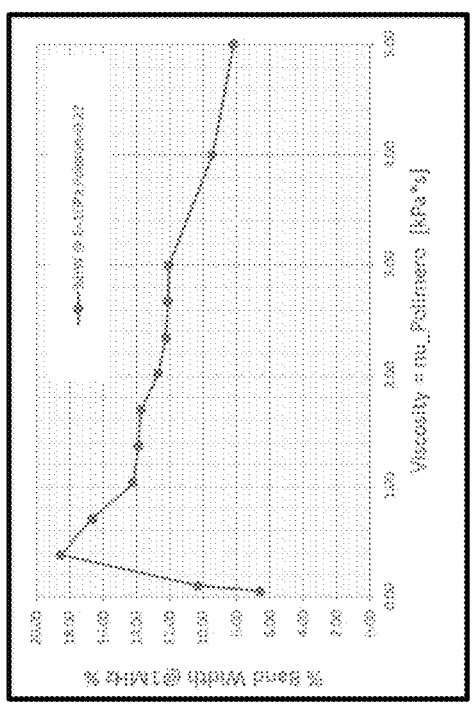
FIG. 2 is a diagram showing the % bandwidth of the PMUT device of FIGS. 1A and 1C as a function of the viscosity and of the Young's modulus of the polymeric material of the polymeric member.

FIG. 2 is a diagram showing the % bandwidth centered on 1 MHz of an exemplary PMUT device 100 according to the embodiment of the disclosure illustrated in FIGS. 1A-1B as a function of the viscosity of the polymeric material of the polymeric member 190 when said polymeric material has a Poisson's ratio of 0.22 and a Young's modulus equal to 1 GPa.

Applicant found that the efficiency of the damper 180 according to the embodiments of the disclosure illustrated in FIGS. 1A-1B in damping undesired free oscillations of the membrane element 125 is particularly high when:

the viscosity of the polymeric material of the polymeric member 190 has a value ranging from 0.3 to 3 kPa*s, and/or the Young's modulus of the polymeric material of the polymeric member 190 has a value ranging from 0.5 to 2 GPa.

Figure 3B:
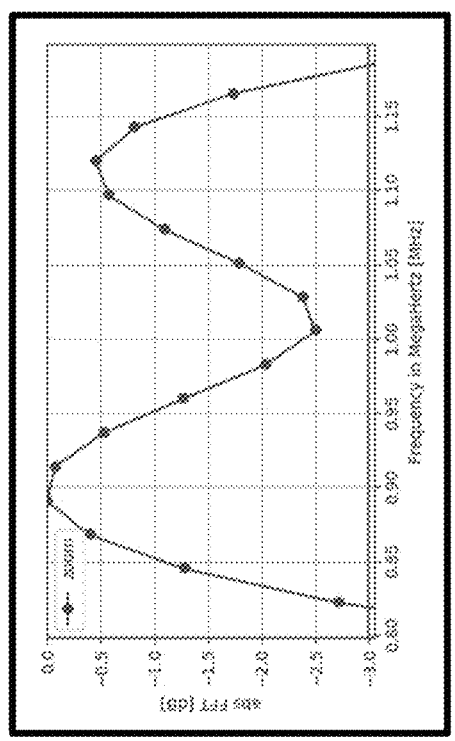

FIG. 3A depicts a diagram of the frequency response of the PMUT device 100 illustrated in FIG. 1A-1C, in which the first membrane portion MP(1) has a diameter of 300 μm and the second membrane portion MP(2) has a diameter of 260 μm. FIG. 3B is an enlarged view of the portion of the diagram of FIG. 3A highlighted by the dashed rectangular frame 300.

The frequency response of the PMUT device 100 exhibits two frequency peaks, each one corresponding to the resonance frequency of a corresponding membrane portion. In the example at issue, these two peaks comprise:

a first peak at 0.92 MHz and corresponding to the first membrane portion MP(1), and a second peak at 1.1 MHz and corresponding to the second membrane portion MP(2).

The partial overlap between the first and second membrane portions MP(1), MP(2) ensures that said two peaks are close to each other. Therefore, said two peaks merge into a larger peak corresponding to a (larger) % bandwidth centered at about 1 MHz. The resulting % bandwidth of the PMUT device 100 is further increased thanks to the damping effect of the damper 180. In the example at issue, the % bandwidth centered on 1.1 MHz can advantageously reach 37%.

FIGS. 4A-4G illustrate main phases of a manufacturing process for manufacturing the PMUT device 100 of FIGS. 1A-1C according to an embodiment of the present disclosure.

Making reference to FIG. 4A, the manufacturing process according to this embodiment of the disclosure starts by providing the silicon substrate 110 and then forming in said silicon substrate 110 the cavity 120 and the horizontal portion 195 of the cavity 185 surrounding the cavity 120 itself (see FIG. 1A).

According to an embodiment of the present disclosure, the formation of the cavity 120 and of the horizontal portion 195 of the cavity 185 is carried out based on the method disclosed in the patent U.S. Pat. No. 7,294,536 and in the patent application US 2008/261345 (filed by the same Applicant). Briefly, lithographic masks are used having a honeycomb lattice. Then, using said masks, trench etching of the silicon substrate is performed to form corresponding silicon columns. After the removal of the lithographic masks, epitaxial growth is performed in a deoxidizing environment (e.g., in an atmosphere with a high concentration of hydrogen, preferably using $SiHCl_3$), so that an epitaxial layer grows on top of the silicon columns, trapping gas ($H_2$) present therein. An annealing step is then carried out, causing a migration of the silicon atoms, which tend to arrange themselves in lower energy positions. Consequently, the silicon atoms of the silicon columns migrate completely forming the cavity 120 and of the horizontal portion 195 of the cavity 185.

The portion of the silicon substrate 110 directly over the cavity 120 forms the membrane element 125.

The next phase of the manufacturing process according to this embodiment of the disclosure, illustrated in FIG. 4B, comprises the deposition of an oxide layer 401 on the front operative surface 112, for example by means of a Low pressure Chemical Vapor Deposition (LPCVD using tetraethyl orthosilicate as precursor).

The next phase of the manufacturing process according to this embodiment of the disclosure, illustrated in FIG. 4C, provides for:

deposing on the oxide layer 401 a USG layer 402;

deposing on the USG layer 402 a stack comprising a layer of piezoelectric material, e.g., comprising aluminum nitride, between two conductive layers, for example a TiW layer and a platinum layer, and patterning said stack to form the piezoelectric elements 150(1) and 150(2) over the cavity 120 by obtaining the layers 155, 160, 162 (see FIG. 1A);

covering the piezoelectric elements 150(1) and 150(2) with a first passivation layer comprising USG, and patterning said passivation layer to obtain the first passivation layer 170, and deposing a second passivation layer 412 comprising Silicon Nitride.

The next phase of the manufacturing process according to this embodiment of the disclosure, illustrated in FIG. 4D, provides for selectively removing the second passivation layer 412 the USG layer 402 and the oxide layer 401 using a properly defined lithographic mask 410 to obtain the second passivation layer 172, the USG layer 162 and the insulating material layer 168 (see FIG. 1C).

The next phase of the manufacturing process according to this embodiment of the disclosure, illustrated in FIG. 4E, provides for opening a trench in the front operative surface 112 of the silicon substrate 110 over the horizontal portion 195 of the cavity 185 until reaching said horizontal portion 195 in order to form the vertical portion 198 of the cavity 185 (see FIG. 1A). According to an embodiment of the present disclosure, this phase is carried out by performing a selective dry silicon etching using a properly defined lithographic mask 430.

The next phase of the manufacturing process according to this embodiment of the disclosure, illustrated in FIG. 4F, provides for removing the lithographic masks 420 and 430, and then deposing a laminate dry polymer film 440, covering, among others, the horizontal portion 195 of the cavity 185.

The following phase of the manufacturing process according to this embodiment of the disclosure, illustrated in FIG. 4G, provides for selectively removing the laminate dry polymer film 440 to obtain the polymeric member 190 over the cavity 185 (and then to obtain the PMUT device 100 of FIG. 1A).

FIG. 5A shows a different version of the PMUT device 100, identified with reference 100', according to another embodiment of the present disclosure. The elements of the PMUT device 100' corresponding to the elements of the PMUT device 100 will be identified using the same references used in FIG. 1A with the addition of an apex, and their description will be omitted for the sake of brevity. Compared to the PMUT device 100 of FIG. 1A, and manufactured with the manufacturing process described with reference to FIGS. 4A-4G, the PMUT device 100' is manufactured by forming the cavity 120', and the cavity 185' using as starting substrate a Silicon-On-Insulator (SOI) substrate 110' comprising (starting from the top, and then proceeding along the direction X toward the bottom) an active layer (device layer), a buried oxide layer (box layer), and a support layer (handle layer). According to this embodiment of the disclosure, the cavity 120' and the cavity 185' are realized by selectively removing portions of the box layer, identified in FIG. 5A with reference 510.

FIG. 5B shows a different version of the PMUT device 100 identified with reference 100", according to another embodiment of the present disclosure. The elements of the PMUT device 100" corresponding to the elements of the PMUT device 100 will be identified using the same references used in FIG. 1A with the addition of a double apex, and their description will be omitted for the sake of brevity. Compared to the PMUT device 100 of FIG. 1A, and manufactured with the manufacturing process described with reference to FIGS. 4A-4G, the PMUT device 100" is manufactured by forming the cavities 120" and 185" and the membrane using porous polysilicon 520 deposed on the silicon substrate 110". According to an embodiment of the present disclosure, porous polysilicon 520 is deposed using a LPCVD process at 600° C. from pure silane source gas at 550 mtorr. Thanks to its porosity, the porous polysilicon 520 is permeable to HF etching.

While in the previous figures reference has been made to a PMUT device comprising two piezoelectric members located on the top surface of the membrane element, and therefore in which the membrane element comprises two membrane portions, the concepts of the present disclosure directly apply to cases in which a higher number of piezoelectric members, and therefore membrane portions, is provided.

For example, in the example illustrated in FIG. 6A, three membrane portions MP(1), MP(2), MP(3) are provided, corresponding to three respective piezoelectric members 150(1), 150(2), 150(3), while in the example illustrated in FIG. 6B, four membrane portions MP(1), MP(2), MP(3), MP(4) are provided, corresponding to four respective piezoelectric members 150(1), 150(2), 150(3), 150(4).

FIG. 7 illustrates in terms of simplified blocks an electronic system 700 (or a portion thereof) comprising at least one of the PMUT devices 100, 100', or 100" according to the embodiments of the disclosure described above.

According to an embodiment of the present disclosure, the electronic system 700 is adapted to be used in electronic devices such as for example personal digital assistants, computers, tablets, and smartphones.

According to an embodiment of the present disclosure, the electronic system 700 may comprise, in addition to the PMUT device 100, 100', or 100", a controller 705, such as for example one or more microprocessors and/or one or more microcontrollers.

According to an embodiment of the present disclosure, the electronic system 700 may comprise, in addition to the PMUT device 100, 100', or 100", an input/output device 710 (such as for example a keyboard, and/or a touch screen and/or a visual display) for generating/receiving messages/commands/data, and/or for receiving/sending digital and/or analogic signals.

According to an embodiment of the present disclosure, the electronic system 700 may comprise, in addition to the PMUT device 100, 100', or 100", a wireless interface 715 for exchanging messages with a wireless communication network (not shown), for example through radiofrequency signals. Examples of wireless interface 715 may comprise antennas and wireless transceivers.

According to an embodiment of the present disclosure, the electronic system 700 may comprise, in addition to the PMUT device 100, 100', or 100", a storage device 720, such as for example a volatile and/or a non-volatile memory device.

According to an embodiment of the present disclosure, the electronic system 700 may comprise, in addition to the PMUT device 100, 100', or 100", a supply device, for example a battery 725, for supplying electric power to the electronic system 700.

According to an embodiment of the present disclosure, the electronic system 700 may comprise one or more communication channels (buses) 730 for allowing data exchange between the PMUT device 100, 100', or 100" and the controller 705, and/or the input/output device 710, and/or the wireless interface 715, and/or the storage device 720, and/or the battery 725, when they are present.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in other embodiments.

A PMUT device may be summarized as including: a membrane element a membrane element extending perpendicularly to a first direction and adapted to generate and receive ultrasonic waves by oscillating about an equilibrium position; at least two piezoelectric elements each one located over said membrane element along said first direction and configured to: cause the membrane element to oscillate when electric signals are applied to the piezoelectric element, and generate electric signals in response to oscillations of the membrane element. The membrane element has a lobed shape along a plane perpendicular to the first direction, said lobed shape comprising at least two lobes; and the membrane element comprises for each piezoelectric member a corresponding membrane portion including a corresponding lobe, each piezoelectric member being located over its corresponding membrane portion.

Each membrane portion may have a same shape but a size different from the size of the other membrane portions.

Each membrane portion may be the largest portion of the membrane element having said shape surrounding the corresponding piezoelectric member coaxial thereto.

The shape may be a selected one among: a substantially circular shape; a substantially square shape, a substantially rectangular shape; a substantially triangular shape; a substantially hexagonal shape; or a substantially octagonal shape.

The PMUT device may further comprise: a damper configured to reduce free oscillations of the membrane element, the damper comprising: a damper cavity surrounding the membrane element; a polymeric member having at least a portion thereof over said damper cavity along said first direction.

The polymeric member may comprise a polymeric material, said polymeric material having: a viscosity having a value ranging from 0.3 to 3 kPa*s, and/or a Young's modulus having a value ranging from 0.5 to 2 GPa.

The damper cavity may encircle the membrane element along a plane substantially perpendicular to said first direction.

The PMUT device may further include a semiconductor substrate, said damper cavity being at least partially formed in said semiconductor substrate.

The PMUT device may further include a central cavity under said membrane element along said first direction, said damper cavity surrounding the central cavity perpendicularly to said first direction.

The membrane element may include monocrystalline silicon or polysilicon.

An electronic system may be summarized as including one or more PMUT devices as set forth above.

A method for manufacturing a PMUT device may be summarized as including the following phases: forming a membrane element extending perpendicularly to a first direction; forming over said membrane element along the first direction at least two piezoelectric elements, wherein: the membrane element has a lobed shape along a plane perpendicular to the first direction, said lobed shape comprising at least two lobes, the membrane element comprising for each piezoelectric member a corresponding membrane portion including a corresponding lobe, each piezoelectric member being located over its corresponding membrane portion.

The method may further include: forming a damper, said forming a damper comprising: forming damper cavity surrounding the membrane element, and forming a polymeric member having at least a portion thereof over said damper cavity along said first direction.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Piezoelectric Micromachined Ultrasonic Transducer (PMUT) device, comprising:
   a membrane element extending perpendicularly to a first direction and configured to generate and receive ultrasonic waves by oscillating about an equilibrium position; and
   at least two piezoelectric elements, each of the at least two piezoelectric elements located over the membrane element along the first direction and configured to:
      cause the membrane element to oscillate when electric signals are applied to the piezoelectric element, and
      generate electric signals in response to oscillations of the membrane element, wherein:
      the membrane element has a lobed shape along a plane perpendicular to the first direction, the lobed shape including at least two lobes; and
      the membrane element includes for each of the at least two piezoelectric elements a corresponding membrane portion including a corresponding lobe, wherein each of the at least two piezoelectric elements is located over its corresponding membrane portion.

2. The PMUT device of claim 1, wherein each membrane portion has a same shape but a size different from the size of the other membrane portions.

3. The PMUT device of claim 2, wherein each membrane portion is a largest portion of the membrane element having the shape surrounding the corresponding piezoelectric element coaxial thereto.

4. The PMUT device of claim 2, wherein the shape is a selected one among:
   a substantially circular shape;
   a substantially square shape;
   a substantially rectangular shape;
   a substantially triangular shape;
   a substantially hexagonal shape; or
   a substantially octagonal shape.

5. The PMUT device of claim 1, further comprising:
   a damper configured to reduce free oscillations of the membrane element, the damper including:
      a damper cavity surrounding the membrane element; and
      a polymeric member having at least a portion thereof over the damper cavity along the first direction.

6. The PMUT device of claim 5, wherein the polymeric member comprises a polymeric material, the polymeric material having at least one of:
   a viscosity having a value ranging from 0.3 to 3 kPa*s, or
   a Young's modulus having a value ranging from 0.5 to 2 GPa.

7. The PMUT device of claim 5, wherein the damper cavity encircles the membrane element along a plane substantially perpendicular to the first direction.

8. The PMUT device of claim 5, further comprising a semiconductor substrate, the damper cavity being at least partially formed in the semiconductor substrate.

9. The PMUT device of claim 5, further comprising a central cavity under the membrane element along the first direction, the damper cavity surrounding the central cavity perpendicularly to the first direction.

10. The PMUT device of claim 1, wherein the membrane element comprises monocrystalline silicon or polysilicon.

11. An electronic system, comprising:
a Piezoelectric Micromachined Ultrasonic Transducer (PMUT) device, including:
a membrane element extending perpendicularly to a first direction and configured to generate and receive ultrasonic waves by oscillating about an equilibrium position;
at least two piezoelectric elements, each of the at least two piezoelectric elements located over the membrane element along the first direction and configured to:
cause the membrane element to oscillate when electric signals are applied to the piezoelectric element, and
generate electric signals in response to oscillations of the membrane element, wherein:
the membrane element has a lobed shape along a plane perpendicular to the first direction, the lobed shape including at least two lobes; and
the membrane element includes for each of the at least two piezoelectric elements a corresponding membrane portion including a corresponding lobe, wherein each of the at least two piezoelectric elements is located over its corresponding membrane portion; and
a controller coupled to the PMUT device.

12. The electronic system of claim 11, further comprising an input/output device coupled to the PMUT device and to the controller.

13. The electronic system of claim 11, further comprising a wireless interface coupled to the PMUT device and to the controller.

14. The electronic system of claim 11, further comprising a memory device coupled to the PMUT device and to the controller.

15. The electronic system of claim 11, wherein each membrane portion has a same shape but a size different from the size of the other membrane portions.

16. The electronic system of claim 15, wherein each membrane portion is a largest portion of the membrane element having the shape surrounding the corresponding piezoelectric element coaxial thereto.

17. A method for manufacturing a PMUT device, comprising:
forming a membrane element extending perpendicularly to a first direction; and
forming over the membrane element along the first direction at least two piezoelectric elements, wherein:
the membrane element has a lobed shape along a plane perpendicular to the first direction, the lobed shape including at least two lobes, the membrane element including for each of the at least two piezoelectric elements a corresponding membrane portion including a corresponding lobe, wherein each of the at least two piezoelectric elements is located over its corresponding membrane portion.

18. The method of claim 17, further comprising:
forming a damper, the forming the damper including:
forming a damper cavity surrounding the membrane element, and
forming a polymeric member having at least a portion thereof over the damper cavity along the first direction.

19. The method of claim 18, wherein forming the damper cavity includes forming the damper cavity encircling the membrane element along a plane substantially perpendicular to said first direction.

20. The method of claim 18, wherein forming the damper cavity includes forming the damper cavity at least partially in a semiconductor substrate.

* * * * *